(12) United States Patent
Hays

(10) Patent No.: US 6,377,119 B1
(45) Date of Patent: Apr. 23, 2002

(54) FEEDBACK CANCELLATION IMPROVEMENTS

(76) Inventor: Lyman V. Hays, 1604 Castleview Ct., Thousand Oaks, CA (US) 91361

( * ) Notice: Subject to any disclaimer, the term of this patent is extended or adjusted under 35 U.S.C. 154(b) by 0 days.

(21) Appl. No.: 09/448,120

(22) Filed: Nov. 24, 1999

Related U.S. Application Data

(60) Provisional application No. 60/109,982, filed on Nov. 25, 1998.

(51) Int. Cl.$^7$ ................................................. H03F 1/26
(52) U.S. Cl. ........................ 330/149; 330/289; 330/129
(58) Field of Search ................................ 330/107, 109, 330/129, 149, 289, 136

(56) References Cited

U.S. PATENT DOCUMENTS

| | | | |
|---|---|---|---|
| 5,193,224 A | * | 3/1993 | McNicol et al. ............. 455/126 |
| 5,396,189 A | * | 3/1995 | Hays .......................... 330/149 |
| 5,675,288 A | * | 10/1997 | Peyrotte et al. ............. 330/149 |

* cited by examiner

Primary Examiner—Benny Lee
Assistant Examiner—Henry Choe

(57) ABSTRACT

A method for suppressing distortion and removing selected signals from a feedback path in a closed-loop control system is provided. Improvements lie in the manner in which control signals for a vector controller are generated and in the addition of a reference network element which broadens effective cancellation bandwidth. Control signals for the vector controller are derived from various sensors which measure such parameters as temperature, signal level, distortion, etc. Sensor outputs are compared to those stored in a look-up table. Based upon this comparison, a processor decides which set of control signal values will yield improved cancellation of the selected signals. The bandwidth over which cancellation of the selected signals can be achieved is related to how closely the reference signal matches that of the selected signals in the feedback path. Match is controlled by passing the reference signal through a reference network which shapes its amplitude and/or phase.

20 Claims, 2 Drawing Sheets

FEEDBACK CANCELLATION IMPROVEMENTS

CROSS-REFERENCE TO RELATED APPLICATIONS

This application is entitled to the benefit of Provisional Patent Application 60/109,982 filed Nov. 25, 1998.

FIELD OF THE INVENTION

This invention relates generally to feedback systems in which cancellation techniques are applied to the feedback path. One useful application of these techniques permits suppression of undesired distortion generated by devices such as amplifiers.

BACKGROUND OF THE INVENTION

In recent years, techniques have been developed which improve linearity of amplifier designs using feed-forward cancellation of undesired amplification artifacts (distortion). Numerous examples of feed-forward distortion cancellation are taught in the existing body of patents. While generally providing good distortion suppression, feed-forward techniques have several drawbacks. They tend to be complex; they require an error amplifier; and they usually require addition of a delay element in the output of the main amplifier. Because the error amplifier must be highly linear, it will consume a significant amount of power thus lowering the overall efficiency of the amplifier. The delay element is used to broadband the amplifier. This element must be low loss or overall amplifier efficiency will suffer. Low loss delay elements are generally physically large and thus tend to set a lower bound on amplifier size.

Proper application of feedback cancellation techniques can eliminate the aforementioned drawbacks associated with feed-forward cancellation. Feedback cancellation is described in U.S. Pat. No. 5,396,189 to Hays (1995) which discloses a method and apparatus for adaptively removing selected signals from the feedback path leaving only distortion to be negatively fed back. By this means, both in-band and out-of-band distortion such as intermodulation products and noise can be suppressed without reduction in effective amplifier gain.

SUMMARY OF THE INVENTION

A prime object and advantage of this invention is to provide a flexible alternative to the vector detector/controller combination taught in U.S. Pat. No. 5,386,189 which does not rely upon the comparison of a reference signal with a feedback signal. While application of feedback cancellation to the suppression of amplifier distortion is emphasized herein, the method and apparatus are not limited to this particular application and can be applied to closed-loop control systems in general.

Another object and advantage is to provide a means and method to improve cancellation bandwidth of the feedback signal via incorporation of a network into the reference signal path.

The term "distortion" as used herein refers to any signals present at the output of a device which were not present at its input. Distortion may include such unwanted signals as noise, intermodulation products, harmonics, and so on. The term "desired signal" as used herein refers to the signal or signals which the device is intended to pass and, depending on context, will refer to either signals at the input or output of the device. And the term "in-band" as used herein refers to a frequency band sufficiently wide to pass the desired signal.

DETAILED DESCRIPTION OF ILLUSTRATIVE EMBODIMENTS

Figure 1:
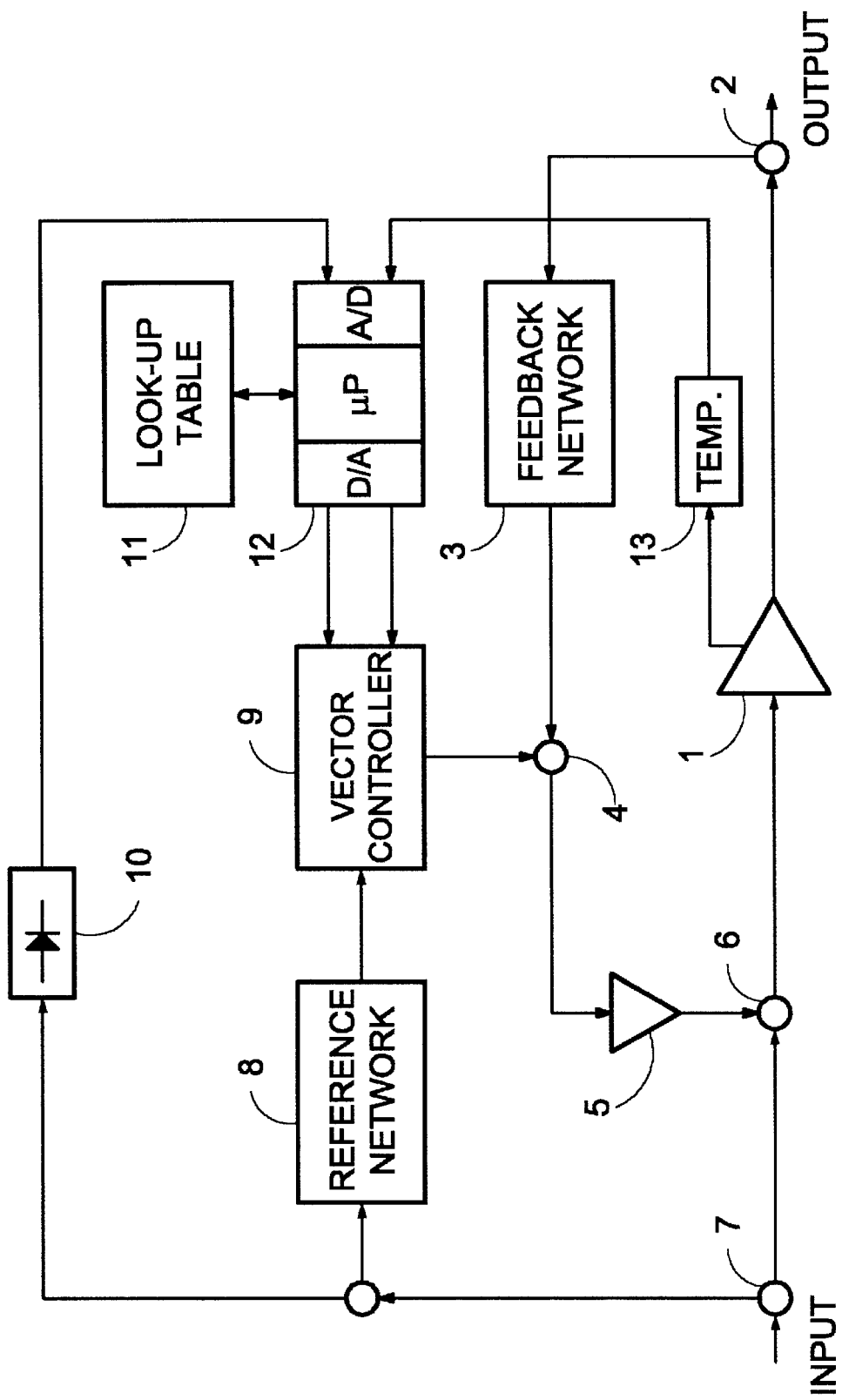
FIG. 1 shows a form of feedback cancellation which employs an alternative to the vector detector/controller combination taught in U.S. Pat. No. 5,386,189.

The embodiment of the invention as shown in FIG. 1 will substantially remove the desired signal from the feedback path using feedback-cancellation techniques. The basic technique of feedback cancellation is described in U.S. Pat. No. 5,396,189; however, FIG. 1 introduces a broad-banding element, reference network 8, and an alternative to the vector detector described in that patent.

Element 1 is the device or process, a gain element for example, which generates the unwanted distortion. Element 1 will be referred to herein as amplifier 1 but such labeling is not intended to limit the scope of element 1. Elements 2 thru 6 comprise a feedback configuration wherein output of amplifier 1 is fed back to its input via output coupler 2, feedback network 3, cancellation summer 4, feedback amplifier 5 and feedback coupler 6. Negative feedback is achieved through the combined phase shift of elements 1 through 6. For example, if amplifier 1 is non-inverting, then negative feedback can be implemented by incorporation of an inverting or phase adjusting characteristic into any suitable combination of the elements in the feedback path. Transformers, delay lines, phase shifters, inverting amplifier, etc. illustrate some of the possible means to achieve the requisite negative feedback over the frequency range of interest. Elements 7, 8 and 9 provide for cancellation of the desired signal in the feedback path. A sample of the desired signal is obtained via input coupler 7. This sample, referred to herein as the reference signal, is then amplitude and phase adjusted by means of vector controller 9 so as to yield a replica of the desired signal, the cancellation signal, which is then introduced into the feedback path via cancellation coupler 4 such that the desired signal is canceled and thus substantially removed from the feedback path. By this means, distortion such as in-band and out of band intermodulation products and noise, for example, can be negatively fed back and thus suppressed without reduction in effective amplifier gain.

Combination or division of signals within a given coupler is not necessarily in equal proportions. For example, output coupler 2 may be configured to route only a small portion of the desired output signal to the feedback path whereas input coupler 7 may be configured to divide its input signal equally. The couplers may take many forms including directional couplers, summers, splitters, active devices, transformers, resistive networks, etc. Vector controllers (also known as vector modulators) are well known; several implementations of which are described in U.S. Pat. No. 5,396,189. Feedback network 3 must, as a minimum, pass those portions of output frequency spectrum containing the distortion to be suppressed. Other factors, such as closed-loop stability and desired degree of distortion suppression, may influence design of feedback network 3. In the following discussion, feedback network 3 is preferentially assumed to consist of an amplitude and phase trimmer although it may take other forms such as a bandpass filter or, in some cases, be eliminated entirely. These trimmers provide a means to modify the amplitude and phase characteristics of the feedback path such that the requisite feedback gain (loss) and polarity is achieved. In alternative embodiments, the feedback network 3 might incorporate elements such as filters, impedance transformers, inverting transformers, and so on. Feedback network 3 is shown preferably located between output coupler 2 and cancellation coupler 4 but, depending on the function(s) it is to perform, the network might be located elsewhere in the feedback path or might even be split into several portions located in several different parts of the feedback path.

Effective cancellation of the desired signal in the feedback path can be accomplished if the level of the reference signal being introduced into the feedback path via cancellation coupler 4 is substantially equal to and in phase opposition to that of the desired signal. This level requirement can be satisfied by insuring the attenuation (or gain) experienced by the desired signal from the input port of coupler 7 to the output port of coupler 4 via paths 7, 8, 9, 4 and 7, 6, 1, 2, 3, 4 are substantially equal. In some embodiments, the level requirement can be met simply by judicious selection of the coupling factors of the aforementioned couplers. The addition of feedback amplifier 5 enables the setting of feedback loop gain independently of any level changes introduced by couplers 2 and 4.

The instantaneous bandwidth over which cancellation of the desired signal can be achieved is related to how closely the cancellation signal matches the portion of the desired signal fed back to cancellation coupler 4. For example, when amplifier 1 has a bandpass characteristic, cancellation bandwidth is improved when a matching characteristic, such as a single-pole bandpass filter, is incorporated into reference network 8. Proper shaping of the amplitude and phase characteristics of reference network 8 can also improve the suppression of out-of-band signals which may appear along with the desired signal at the input to coupler 7 by insuring these out-of-band signals are not canceled and thus diminished through the action of negative feedback. This action can accomplished by using reference network 8 to modify the phase and amplitude of the out-of-band components of the cancellation signal such that, at the output of cancellation coupler 4, the phases of out-of-band components being fed back have been adjusted as necessary to insure their negative feed back.

Figure 2:
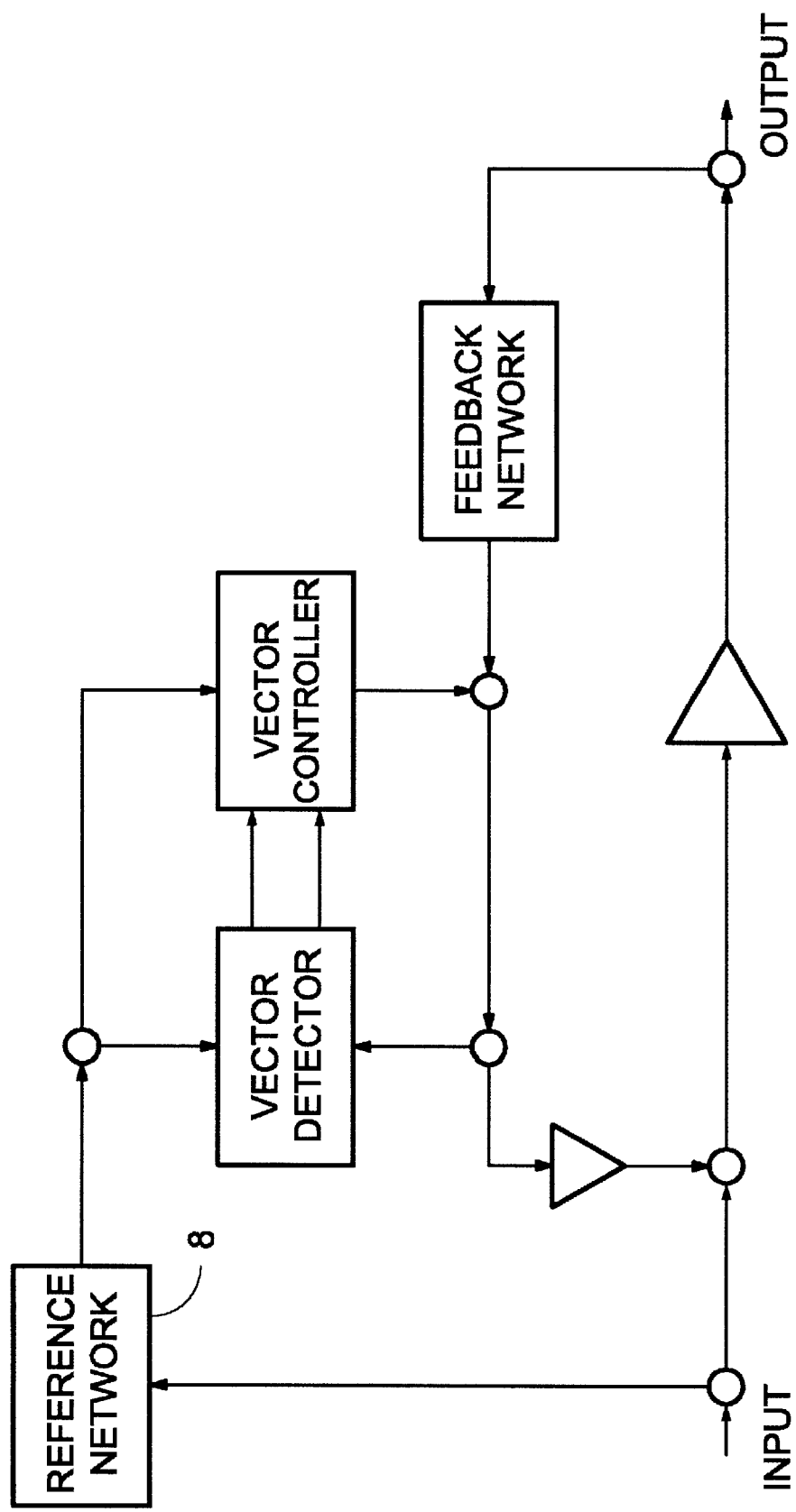
FIG. 2 shows a form of feedback cancellation which employs a vector detector/controller combination per U.S. Pat. No. 5,396,189 and which incorporates a reference network.

FIG. 2 illustrates how a prior-art feedback cancellation system per FIG. 1A of U.S. Pat. No. 5,396,189 can be modified to incorporate a reference network 8 to improve cancellation bandwidth. In like manner, reference network 8 can be added to FIGS. 1B, 1C and 1D of that patent.

Feedback amplifier 5 can be positioned anywhere in the feedback path; in addition, like feedback network 3, amplifier 5 can be split into several portions located in several different parts of the feedback path. However, it is advantageous to place it after cancellation coupler 4 so that the levels of signals it must amplify are diminished by the cancellation process occurring at cancellation coupler 4.

Elements 10 through 13 provide control information to vector controller 9. Their function is to modify the control signals sent to the vector controller 9 in response to changing conditions such as input signal level and amplifier temperature. This embodiment includes a signal level sensor 10 and a temperature sensor 13. Digital controller 12, typically a microprocessor, is shown with integral analog-to-digital and digital-to-analog converters although they can be implemented separately. Lookup table 11 is a memory device, an EPROM for example, in which a multidimensional table of information is stored. Each unique pair of output levels received from sensors 10 and 13 can be mapped to a corresponding pair of amplitude and phase correction values. If the lookup table 11 does not contain an exact match for a given pair of sensor output levels, then interpolation may be employed to estimate the best pair of correction values. During calibration or training, amplifier performance is characterized with respect to signal level and is temperature such that the correction values for amplitude and phase are determined which will result in cancellation of the desired signal at cancellation coupler 4. These correction values and corresponding sensor levels are then stored in lookup table 11. During operation, the digital controller 12 monitors the output of sensors 10 and 13 and modifies the control signal levels sent to vector controller 9 in accordance with the corresponding correction values. Although signal level and temperature control is illustrated, virtually any other parameters which can be sensed, such as distortion level, can be utilized in addition to or in lieu of signal level and temperature. Sensors 10 and 13 are shown in FIG. 1 as using analog communication to the digital controller 12. Sensors having digital outputs can be used as well in which case the A/D conversion process is unnecessary. Sensors 10 and 13 are also shown preferably connected to measure signal input level and amplifier temperature respectively but they could be connected elsewhere, for example, to measure signal output level and ambient temperature.

The principals described herein can be incorporated into the embodiments taught in U.S. Pat. No. 5,396,189. It will be appreciated that the feedback cancellation technique taught herein has wide application in field of feedback control systems and is not restricted in any way to the suppression of distortion in amplifiers. These feedback control systems need not be electrical in nature but can be mechanical, optical, fluidic, magnetic, acoustical, etc. In addition it will be appreciated that a feedback-distortion-compensated amplifier arrangement in accordance with the present invention may itself serve as an amplifier in further pre-distortion, feedback and feed-forward configurations. The above described embodiments and methods are furnished as illustrative of the principles of this invention and are not intended to define the only embodiments possible in accordance with my teaching. Rather, protection under the United States Patent Law shall be afforded to use not only to the specific embodiments shown but to those falling within the spirit and terms of my invention as defined by the following claims.

I claim:

1. A method for canceling a selected signal within a closed-loop control system, the closed-loop control system comprising an input signal, an element modifying said input signal, an output signal, and a feedback path, the method comprising the steps of:

a) providing a selected signal to said feedback path,
   b) deriving a feedback signal from said feedback path,
   c) sensing one or more parameters of the system to be controlled and producing one or more control signals responsive to said sensing,
   d) applying the control signals to said selected signal, thereby deriving a cancellation signal,
   e) applying said cancellation signal to said feedback signal, thereby substantially canceling said selected signal from said feedback signal, and
   f) after said selected signal has been canceled from said feedback signal in the proceeding step, feeding back said feedback signal into said input signal modifying element, g) said control signals may be varied with time imposing said time variation on said cancellation signal and thereby on the amplitude and phase of a corresponding version of said selected signal present in the feedback path.

2. The method of claim 1 wherein the step of applying the control signal to said selected signal ensures that the phase of the cancellation signal is substantially opposed to the phase of a corresponding version of said selected signal present in said feedback signal.

3. The method of claim 1 wherein the step of applying the control signal to said selected signal ensures that the amplitude of said cancellation signal is substantially equal to the amplitude to a corresponding version of said selected signal present in said feedback signal.

4. The method of claim 1 further comprising the step of processing said feedback signal by a feedback network for general control of the feedback loop transfer function.

5. The method of claim 4 wherein said feedback network comprises a bandpass filter.

6. The method of claim 4 wherein said feedback network comprises a phase modification element.

7. The method of claim 1 further comprising the step of processing said selected signal by a reference network.

8. The method of claim 7 wherein said reference network comprises a bandpass filter.

9. The method of claim 7 wherein said reference network comprises a phase modification element.

10. The method of claim 1 further comprising the step of attenuating said feedback signal before the step of combining said feedback signal with said cancellation signal.

11. The method of claim 1 further comprising the step of amplifying said feedback signal after the step of applying said cancellation signal to said feedback signal.

12. The method of claim 1 wherein a vector controller uses the control signals to generate said cancellation signal.

13. The method of claim 1 further comprising the steps of:
    a) providing at least one sensed parameter to a digital processor, and
    b) comparing the sensed parameter with a stored set of correction values, thereby deriving the control signals.

14. The method of claim 13 wherein the sensed parameter is signal level.

15. The method of claim 13 wherein the sensed parameter is temperature.

16. An apparatus for eliminating a selected signal from a feedback path of a closed-loop control system, said closed-loop control system comprising an input signal, an element that modifies said input signal, an output signal, and a feedback path, the apparatus comprising:
    a) means for deriving a feedback signal from said feedback path,
    b) sensor for sensing one or more parameters of the system to be controlled,
    c) control signal generator which generates one or more control signals responsive to said sensing,
    d) cancellation signal generator which generates a cancellation signal by applying the control signals to said selected signal,
    e) signal combiner which generates a combination of said cancellation signal and said feedback signal, thereby substantially canceling said selected signal from said feedback signal, and
    f) signal coupler which feeds back the combination of said cancellation signal and said feedback signal into the modifying element,
    g) a reference network for modification of amplitude and phase of said cancellation signal, thereby controlling cancellation bandwidth and suppression of out-of-band signals.

17. The apparatus of claim 16, wherein said reference network comprises a filter or a delay or an amplifier circuit or a combination of filter, delay and amplifier circuits.

18. An adaptive feedback apparatus for reducing distortion produced by an electrical device, comprising:
    a) an electrical device having an input signal and producing an output signal in response thereto,
    b) an input coupler having as its input said input signal, said input coupler divides said input signal into a primary input signal and one or more secondary input signals,
    c) a feedback coupler having as its input said primary input signal, said feedback coupler combines with said primary input signal one or more negative feedback signals, the combined signal being provided to the input of said electrical device,
    d) an output coupler having as its input said output signal, said output coupler divides said output signal into a primary output signal and one or more secondary output signals,
    e) at least one means for derivation of one or more reference signals from said secondary input signals such that each of said reference signals contains a selected component of said input signal,
    f) at least one operating parameter sensor which produces one or more sensor output signals related to the parameters,
    g) a look-up table wherein predetermined sets of operating parameter values have been stored,
    h) a processor whereby one or more control signals are generated,
    i) at least one combination of one of said negative feedback signals with one of said secondary output signals with one or more vector controllers,
    j) said vector controller for subtractively combining with the secondary output signal associated with a particular combination a phase and amplitude adjusted replica of one of said reference signals to produce the negative feedback signal associated with said particular combination, said adjustment in accordance with one or more control signals provided by the associated processor, and
    k) said processor for automatically generating said control signals by comparing the sensor output signals with the predetermined values stored in said look-up table such that said selected component present in said reference signal is substantially canceled in the negative feedback signal associated with said particular combination, thereby permitting only distortion to be fed back to the input of said electrical device resulting in suppression of said distortion in said primary output signal.

19. The apparatus of claim 18 further including at least one reference network for modifying the reference signal associated with said particular combination.

20. A method for canceling a selected signal within a closed-loop control system, the closed-loop control system comprising an input signal, an element modifying the input signal, an output signal, and a feedback path, the method comprising the steps of:
    a) providing a selected signal to said feedback path,
    b) deriving a feedback signal from said feedback path, c) applying said selected signal to a reference network element, thereby producing a modified selected signal, d) comparing said modified selected signal with said feedback signal, thereby deriving one or more control signals, e) applying the control signals to said modified selected signal, thereby deriving a cancellation signal, f) applying said cancellation signal to said feedback signal, thereby substantially canceling said selected signal from said feedback signal, and g) after said selected signal has been canceled from said feedback signal in the proceeding step, feeding back said feedback signal into said input modifying element.

* * * * *